(12) United States Patent
Matsuda et al.

(10) Patent No.: US 7,553,602 B2
(45) Date of Patent: Jun. 30, 2009

(54) TRANSFER SUBSTRATE, TRANSFER METHOD, AND ORGANIC ELECTROLUMINESCENT DEVICE MANUFACTURING METHOD

(75) Inventors: Eisuke Matsuda, Kanagawa (JP);
Takashi Hirano, Kanagawa (JP)

(73) Assignee: Sony Corporation, Tokyo (JP)

( * ) Notice: Subject to any disclaimer, the term of this patent is extended or adjusted under 35 U.S.C. 154(b) by 227 days.

(21) Appl. No.: 11/615,213

(22) Filed: Dec. 22, 2006

(65) Prior Publication Data

US 2008/0124647 A1    May 29, 2008

(30) Foreign Application Priority Data

Dec. 26, 2005 (JP) ............................. P2005-371748

(51) Int. Cl.
*G03F 7/00* (2006.01)

(52) U.S. Cl. .................................. 430/200; 430/270.1

(58) Field of Classification Search ............... 430/270.1
See application file for complete search history.

(56) References Cited

U.S. PATENT DOCUMENTS 6,214,520 B1 * 4/2001 Wolk et al. ............... 430/273.1
2002/0172887 A1 * 11/2002 Wolk et al. ............... 430/200

FOREIGN PATENT DOCUMENTS

JP    2002-110350    4/2002
JP    2004-247309    9/2004

* cited by examiner

*Primary Examiner*—Amanda C. Walke
(74) *Attorney, Agent, or Firm*—Sonnenschein Nath & Rosenthal LLP (57) ABSTRACT

A transfer substrate includes: a support substrate; a light-to-heat conversion layer; a diffusion prevention layer preventing diffusion of a material constituting the light-to-heat conversion layer; and a transfer layer made of an organic material, wherein the light-to-heat conversion layer, the diffusion prevention layer and the transfer layer are formed on the support substrate in this order.

8 Claims, 4 Drawing Sheets

TRANSFER SUBSTRATE, TRANSFER METHOD, AND ORGANIC ELECTROLUMINESCENT DEVICE MANUFACTURING METHOD

CROSS REFERENCES TO RELATED APPLICATIONS

The present invention contains subject matter related to Japanese Patent Application JP 2005-371748 filed in the Japanese Patent Office on Dec. 26, 2005, the entire contents of which being incorporated herein by reference.

BACKGROUND OF THE INVENTION

1. Field of the Invention

The present invention relates to a transfer substrate, a transfer method, and an organic electroluminescent device manufacturing method and, more specifically, to a transfer substrate that is suitably used for patterning of an organic material layer, a transfer method using the transfer substrate, and an organic electroluminescent device manufacturing method.

2. Description of the Related Art

An organic electroluminescent device (hereinafter, referred to as organic EL device) utilizing electroluminescence of an organic material has been receiving attention as a luminescent device that is capable of high-brightness light emission by low-voltage direct drive. The organic EL device includes an organic layer being an accumulation of a hole transport layer and a luminescent layer between a lower electrode and an upper electrode.

A full-color display device of an exemplary type using such an organic EL device includes organic EL devices of various colors, i.e., R (red), G (green), and B (blue). These organic EL devices are disposed in an array on a substrate. In order to manufacture such a display device, there needs to form at least a luminescent layer through patterning on a luminescent device basis. The luminescent layer is the one made of an organic luminescent material that emits one color. Patterning of the luminescent layer includes shadow masking, ink jet, or others. With shadow masking, a luminescent material is applied to a sheet by vapor deposition or coating via an aperture-patterned mask, for example.

The issue here is that the patterning with such shadow masking has problems of a difficulty in finer patterning of the apertures formed to the mask, of a difficulty in patterning to areas of luminescent devices with high position accuracy if the mask is deformed in shape or increased in size, and others. Such problems increase the difficulty in finer patterning of organic EL devices and high-density designing. What is more, due to the exposure to the aperture-patterned mask, functional layers mainly including the previously-formed organic layer are susceptible to damages, and this is the cause of the reduction of the manufacturing yield.

The patterning with ink jet has the limits of patterning accuracy, thereby resulting in a difficulty in finer patterning of organic EL devices, high density designing, and size increase of substrates.

In consideration thereof, as a new patterning method for a luminescent layer configured by an organic material or any other functional layers, proposed is a transfer method using an energy source (heat source), i.e., thermal transfer. A display device using such thermal transfer is manufactured as below, for example. First of all, a substrate of a display device (hereinafter, referred to as device substrate) is formed thereon with a lower electrode. A separately-provided support substrate is formed thereon with a luminescent layer (transfer layer) via a light absorption layer for light-to-heat conversion. The result is a transfer substrate. The light absorption layer is exemplified by a pigment such as coloring agent or carbon, or a metal including nickel or titanium. The device substrate and the transfer substrate are so disposed that the luminescent layer faces the lower electrode. The resulting layer accumulation is exposed to a laser light from the side of the transfer substrate so that the luminescent layer is thermally transferred onto the lower electrode of the device substrate. At this time, through scanning of the layer accumulation with spot irradiation of the laser light, the luminescent layer is thermally transferred only to a predetermined area on the lower electrode. For more details, refer to Patent Document 1 (JP-A-2002-110350; paragraphs 0007 and 0081).

With thermal transfer, proposed is the configuration including a performance-increase layer above the luminescent layer. This is aimed not to cause luminescent layers to be turned off in or between processes that is often occurs due to adhesion and contamination of oxygen or water. The performance-increase layer includes a metal material such as alkali metal or an organic chemical reductant, and is formed above the luminescent layer by thermal vaporization, electron beam vaporization, or others. For more details, refer to Patent Document 2 (JP-A-2004-247309).

SUMMARY OF THE INVENTION

With the transfer method using such a transfer substrate, however, at the time of thermal transfer, it turned out that at least a part of the light absorption layer for use for light-to-heat conversion finds its way into the transfer layer. The light absorption layer finding its way into the thermal layer as such seems to reduce the luminescence efficiency and shorten the brightness duration. This is still true even if a performance-increase layer is provided above the luminescent layer formed by thermal transfer.

It is thus desirable to provide a transfer substrate that can thermally transfer, with no mixture of impurity, a transfer layer formed on the transfer substrate side to the side of a receptor. It is also desirable to provide a transfer method with which a transfer layer can be thermally transferred to the receptor side with no mixture of impurity, and an organic EL device manufacturing method that can keep high the luminescent efficiency and keep long the brightness duration with a luminescent layer formed by thermal transfer with no mixture of impurity.

According to an embodiment of the present invention, there is provided a transfer substrate including a support substrate; a light-to-heat conversion layer; a diffusion prevention layer preventing diffusion of a material constituting the light-to-heat conversion layer; and a transfer layer made of an organic material. In the transfer substrate, the light-to-heat conversion layer, the diffusion prevention layer and the transfer layer are formed on the support substrate in this order.

Herein, the expression of "diffusion of a material" means that at least a part of the material exists beyond the area that is initially expected for the material to exist. The degree of material expansion and the amount of material are not issues here.

With the transfer substrate configured as such, the diffusion prevention layer provided between the light-to-heat conversion layer and the transfer layer to prevent diffusion of a material configuring the light-to-heat conversion layer serves well so that the material does not diffuse from the light-to-heat conversion layer to the side of the transfer layer.

According to another embodiment of the present invention, there is provided a transfer method using the transfer substrate described above. The transfer method includes the steps of: disposing the transfer substrate with an arrangement of the transfer layer being directed to a receptor; and thermally transferring the transfer layer to the receptor side by irradiation of a light from the support substrate side in the transfer substrate such that the light is thermally converted in the light-to-heat conversion layer while diffusion of a material constituting the light-to-heat conversion layer is prevented.

According to still another embodiment of the present invention, there is provided an organic EL device manufacturing method including the steps of: forming a lower electrode layer patterned on a substrate; forming an organic layer including at least a luminescent layer on the lower electrode, and forming an upper electrode in the state that the upper electrode is laminated over the lower electrode via the organic layer. With the manufacturing method, the above-described transfer method is executed when the luminescent layer is formed on the lower electrode. In this case, the transfer layer of the transfer substrate is assumed as being configured by an organic material including a luminescent material.

As such, according to the invention, the diffusion prevention layer serves well not to cause material diffusion from the light-to-heat conversion layer to the transfer layer side so that the transfer layer can be thermally transferred to the receptor side with no mixture of impurity. This accordingly enables to form, in the process of manufacturing an organic EL device, a luminescent layer with no mixture of impurity by such thermal transfer. The resulting organic EL device can thus be high in luminescent efficiency and long in brightness duration.

DETAILED DESCRIPTION OF THE INVENTION

In the below, an embodiment of the invention is described by referring to the accompanying drawings. In the embodiment below, described is how to manufacture a transfer substrate and a display device, including a transfer method using the transfer substrate. The transfer substrate here is used to manufacture a full-color display device including organic EL devices of various colors, i.e., R (red), G (green), and B (blue), disposed in an array on a substrate.

a. Transfer Substrate

Figure 1:
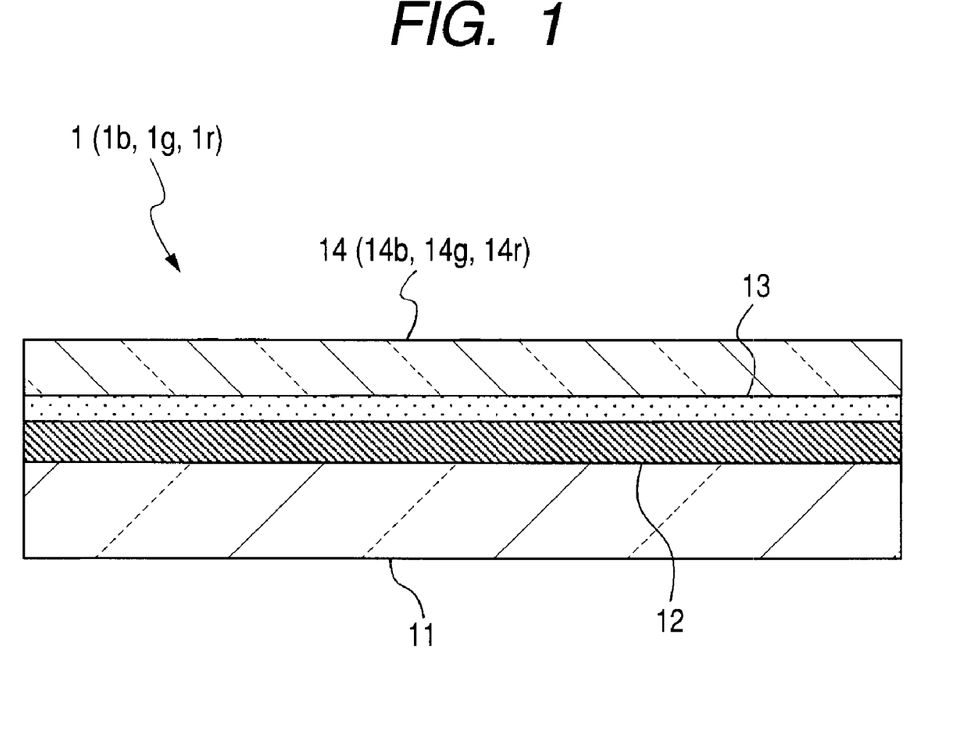
FIG. 1 is a cross sectional diagram showing the configuration of a transfer substrate of an embodiment.

FIG. 1 is a cross sectional diagram for illustrating the configuration of a transfer substrate 1 in this embodiment. The transfer substrate 1 of FIG. 1 is used to form a luminescent layer of an organic EL device, for example. The transfer substrate 1 is configured to include, on a support substrate 11, a light-to-heat conversion layer 12, a diffusion prevention layer 13, and a transfer layer 14 in this order.

The support substrate 11 is made of a material that passes through a light hr of a predetermined wavelength, which is irradiated for transfer using the transfer substrate 1. For example, when the light hr is a laser light of a wavelength of about 800 nm coming from a solid-state laser light source, the support substrate 11 may be a glass substrate.

The light-to-heat conversion layer 12 is configured by using a material showing a high light-to-heat conversion efficiency of converting the light hr into heat, and a high melting point. When the light hr is the laser light of a wavelength of about 800 nm exemplified above, for example, the light-to-heat conversion layer 12 is preferably made of a high-melting-point metal with a low reflection coefficient, e.g., chromium (Cr) or molybdenum (Mo). This light-to-heat conversion layer 12 is assumed as being adjusted in thickness so as to lead to the light-to-heat conversion efficiency of a sufficient level as required. When the light-to-heat conversion layer 12 is configured by a molybdenum (Mo) film, the thickness thereof is assumed as being about 200 nm. Such a light-to-heat conversion layer 12 is formed by sputtering, for example. Note here that the light-to-heat conversion layer 12 is not restrictive to the above-described metal materials, and may be a film made of a light absorption material of a pigment or carbon.

The diffusion prevention layer 13 being characteristics of the invention serves to prevent diffusion of a material configuring the light-to-heat conversion layer 12. Such a diffusion prevention layer 13 is preferably configured by a material being excellent in thermal conductivity and stable in performance, e.g., configured by nitride or oxide of silicon. To be specific, the diffusion prevention layer 13 is exemplified by a silicon oxide film ($SiO_2$), a silicon nitride film (SiNx), a silicon oxynitride film (SiONx), and others. Among these, the silicon nitride film (SiNx) is considered especially preferable as can be of the closely-packed film configuration, and as not cause oxidation to the transfer layer 14 and the light-to-heat conversion layer 12 unlike the diffusion prevention layer 13 of any other materials. Alternatively, the diffusion prevention layer 13 may be configured by a metal oxide or nitride film such as titanium nitride (TiN) or titanium oxynitride (TiON), or an organic material. The organic material is assumed as showing, if used, good heat resistance, e.g., fully cross-linked polyimide.

The diffusion prevention layer 13 made of such materials may be a laminate of layers made of such materials.

The transfer layer 14 is made of an organic material including the material configuring the luminescent layer, which is formed by thermal transfer using the transfer substrate 1. For example, the transfer layer 14 is configured by luminescent guest materials of various colors and a host material. The luminescent guest materials here may be fluorescent or phosphor. The host material is at least being a hole carrier, an electron carrier, or a both-charge carrier.

When the transfer substrate 1 is a transfer substrate 1b for formation of a blue luminescent layer, for example, a blue transfer layer 14b including a blue luminescent material is provided to serve as the transfer layer 14. This blue transfer layer 14b is configured by a material being a mixture of a blue luminescent guest material, i.e., 4,4'-bis[2-{4-(N,N-diphenylamine)phenyl}vinyl]biphenyl (DPAVBi) to a material of ADN (anthracene dinaphtyl) with the weight percentage of 2.5. The ADN is a host material being an electron carrier, for example. The blue transfer layer 14b is assumed as being formed by vapor deposition with the thickness of about 30 nm.

When the transfer substrate 1 is a transfer substrate 1g for formation of a green luminescent layer, for example, a green transfer layer 14g including a green luminescent material is provided to serve as the transfer layer 14. This green transfer layer 14g is configured by a material being a mixture of coumarin 6 being a green luminescent guest material to the ADN with the weight percentage of 5. The green transfer layer 14g is assumed as being formed by vapor deposition with the thickness of about 30 nm.

Similarly, when the transfer substrate 1 is a transfer substrate 1r for formation of a red luminescent layer, for example, a red transfer layer 14r including a red luminescent material is provided to serve as the transfer layer 14. This red transfer layer 14r is configured by a material being a mixture of a red luminescent guest material, i.e., 2,6'-bis[(4'-methoxy-diphenylamine)styryl]-1,5-dicyano-naphthalene (BSN) to the ADN with the weight percentage of 30. The red transfer layer 14r is assumed as being formed by vapor deposition with the thickness of about 30 nm.

b. Display Device Manufacturing Method

FIGS. 2A to 4B are all a cross sectional view of a display device of this embodiment, showing a transfer method using the transfer substrate 1 (1b, 1g, 1r) of the above configuration, and a display device manufacturing method including an organic EL device manufacturing method using the transfer method. In the below, the process procedure is described by referring to FIGS. 2A to 4B.

Figure 2A:
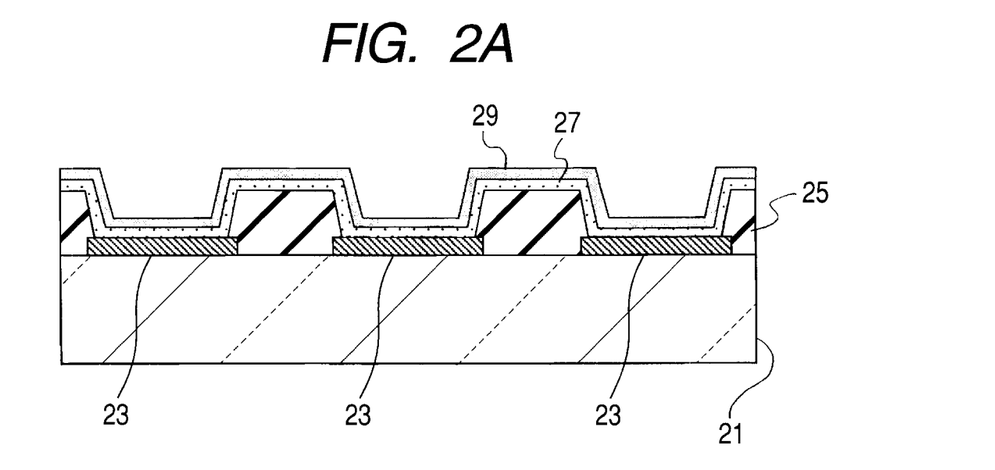
FIGS. 2A and 2B are both a cross sectional view of a display device of the embodiment, showing a first manufacturing process.

First of all, as shown in FIG. 2A, prepared is a device substrate 21 including organic EL devices disposed thereon in an array. This substrate 21 is exemplarily made of glass, silicon, or plastic, or is exemplified by a TFT substrate formed thereon with a TFT (thin film transistor). Specifically when the display device of this embodiment is of a transmissive type, i.e., the luminescent light is extracted from the side of the device substrate 21, the device substrate 21 is configured by a light transmissive material.

The device substrate 21 is then patterned with a lower electrode 23, which is used as an anode or a cathode.

This lower electrode 23 is assumed as being patterned in the form suitable for a drive mode whichever used in the display device to be manufactured in this embodiment. If the display device uses a drive mode of direct matrix, for example, the lower electrode 23 is exemplarily formed in strip shape. If the display device uses a drive mode of active matrix, i.e., TFT is equipped for every pixel, the lower electrode 23 is so patterned as to correspond to a plurality of pixels disposed in an array, and is so formed as to be connected to the TFTs respectively provided to the pixels via a contact hole (not shown). The contact hole is formed to an inter-layer insulation film covering the TFTs.

The material of the lower electrode 23 is selected to suit how the light is extracted in the display device of this embodiment. That is, if the display device is of a type, i.e., the luminescent light is extracted from the side opposite to the device substrate 21, the lower electrode 23 is configured by a highly-reflective material. On the other hand, if the display device is of a transmissive type or a dual-side emitting type, i.e., the luminescent light is extracted from the side of the device substrate 21, the lower electrode 23 is configured by a light-transparent material.

Considered here is a case where the display device is of a top emitting type, and the lower electrode 23 is used as an anode. In this case, the lower electrode 23 is configured by a highly-reflective conductive material, e.g., silver (Ag), aluminum (Al), chromium (Cr), iron (Fe), cobalt (Co), nickel (Ni), copper (Cu), tantalum (Ta), tungsten (W), platinum (Pt), or gold (Au), and an alloy thereof.

In another case where the display device is of a top emitting type, but the lower electrode 23 is used as a cathode, the lower electrode 23 is configured by a conductive material with a low work function. Such a conductive material includes an alloy of active metal such as Li (lithium), Mg (magnesium), or Ca (calcium), and a metal such as Ag, Al, or In (indium) Alternatively, the lower electrode 23 may be a laminate of layers of such metals. Alternatively, a thin compound layer may be disposed between the lower electrode 23 and the functional layer 4. The compound layer may be of an active metal such as Li, Mg, or Ca, halogenan such as fluorine, bromine, oxygen, and others.

In still another case where the display device is of a transmissive type or a dual-side emitting type, and the lower electrode 23 is used as an anode. In such a case, the lower electrode 23 is configured by a conductive material having a high transmittance, e.g., ITO (Indium-Tin-Oxide) or IZO (Indium-Zinc-Oxide).

Note here that if the display device to be manufactured in this embodiment uses a drive mode of active matrix, for example, the display device is preferably of a top emitting type to ensure the aperture ratio for the organic EL devices.

After the lower electrode 23 (anode in this example) is formed as such, an insulation film 25 is patterned in such a state as to cover the outer edge of the lower electrode 23. With such patterning, a portion of a window formed to the insulation film 25 from which the lower electrode 23 is exposed is regarded as a pixel area for disposition of any corresponding organic EL device. This insulation film 25 is assumed as being configured by an organic insulation material such as polyimide or photoresist, or an inorganic insulation material such as silicon oxide.

A hole injection layer 27 is then formed as a common layer to cover the lower electrode 23 and the insulation film 25. Such a hole injection layer 27 is configured by using a general hole injection material, and as an example, a film of m-MT-DATA [4,4,4-tris(3-methylphenylphenylamino)triphenylamine] is formed by vapor deposition with a film thickness of 25 nm.

A hole transport layer 29 is then formed as a common layer to cover the hole injection layer 27. Such a hole transport layer 29 is configured by using a general hole transport material, and as an example, a film of α-NPD[4,4-bis(N-1-naphthyl-N-phenylamino)biphenyl] is formed by vapor deposition with a film thickness of 30 nm. Note here that the general hole transport material configuring the hole transport layer 29 includes a benzene derivative, a styrylamine derivative, a triphenylmethane derivative, a hydrazone derivative, and others.

Alternatively, the hole injection layer 27 and the hole transport layer 29 may be of a laminate of a plurality of layers.

The above-described process procedure may be executed similarly to the procedure of manufacturing a display device using general organic EL devices. In the next process, the hole transport layer 29 formed as above is formed thereon with luminescent layers of various colors by thermal transfer. This process in this embodiment is characterized in using the transfer substrate 1 described by referring to FIG. 1.

Figure 2B:
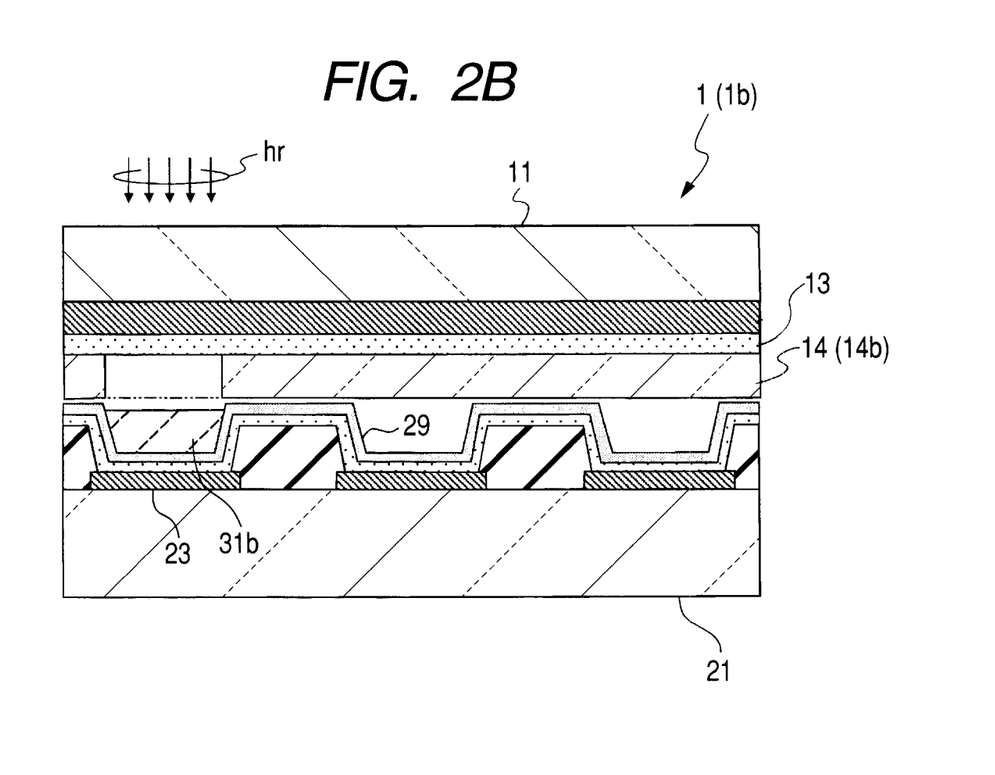

That is, as shown in FIG. 2B, the transfer substrate 1 of the above-described configuration is made ready. In this example, as the transfer layer 14, prepared is the transfer substrate 1b provided with the blue transfer layer 14b for formation of a blue luminescent layer.

This transfer substrate 1b is disposed to face the device substrate 21 formed with the hole transport layer 29. At this time, the transfer substrate 1b and the device substrate 21 are so disposed that the blue transfer layer 14b and the hole transport layer 29 are faced to each other. Alternatively, the device substrate 21 and the transfer substrate 1b may be attached together tightly, and the hole transport layer 29 being the top layer on the side of the device substrate 21 may be made to come in contact with the blue transfer layer 14b being the top layer on the side of the transfer substrate 1b. Even if this is the case, the transfer substrate 1b is supported on the insulation film 25 on the side of the device substrate 21, whereby the blue transfer layer 14b never comes in contact with, even partially, the hole transport layer 29 on the lower electrode 23.

In such a state, from the side of the support substrate 11 of the transfer substrate 1b disposed to face the device substrate 21, the laser light hr of a wavelength of 800 nm is irradiated, for example. At this time, any part corresponding to the area formed with the blue luminescent device is selectively exposed, on a spot basis, with the laser light hr.

As such, the laser light hr is absorbed to the light-to-heat conversion layer 12 for thermal conversion, and utilizing the heat being the conversion result, the blue transfer layer 14b is thermally transferred toward the upper portion of the lower electrode 23 on the side of the device substrate 21. During such thermal transfer, the diffusion prevention layer 13 works well to prevent diffusion of the material configuring the light-to-heat conversion layer 12 to the side of the transfer layer 14b. Thereafter, on the hole transport layer 29 formed on the device substrate 21, a blue luminescent layer 31b is patterned through thermal transfer of the blue transfer layer 14b with good position accuracy.

For such thermal transfer, the irradiation energy of the laser light hr is used to adjust the concentration gradient of the materials configuring the blue transfer layer 14b on the side of the transfer substrate 1b, for example. Specifically, the irradiation energy is set higher so that the blue luminescent layer 31b is formed as a mixture layer in which the materials configuring the blue transfer layer 14b are mixed substantially uniform.

Herein, it is important to irradiate the laser light hr in such a manner that the blue luminescent layer 31b completely covers the lower electrode 23 of the portion formed with the blue luminescent device (pixel area) exposing from the insulation film 25.

By repeating such a process of thermal transfer, the green luminescent layer and the red luminescent layer are formed sequentially.

Figure 3A:
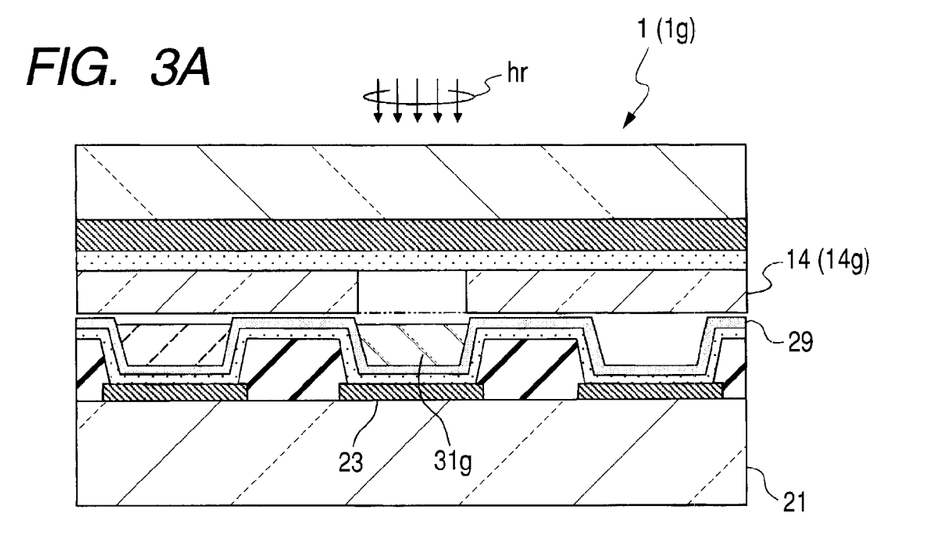
FIGS. 3A and 3B are both a cross sectional view of the display device of the embodiment, showing a second manufacturing process.

That is, as shown in FIG. 3A, the transfer substrate 1 of the above-described configuration is made ready. In this example, as the transfer layer 14, prepared is the transfer substrate 1g provided with the green transfer layer 14g for formation of a green luminescent layer.

This transfer substrate 1g is disposed to face the device substrate 21 formed with the hole transport layer 29. From the side of the transfer substrate 1g, for example, any part of the area formed with the green luminescent device is selectively exposed, on a spot basis, with the laser light hr.

In this manner, on the lower electrode 23 of the device substrate 21 via the hole transport layer 29, a green luminescent layer 31g is patterned through selective thermal transfer of the green transfer layer 14g. For such thermal transfer, similarly to the pattering of the blue luminescent layer 31b described by referring to FIG. 2B, the green luminescent layer 31g is so formed that the materials configuring the green transfer layer 14g are mixed substantially uniform. During such layer formation, the diffusion prevention layer 13 serves well to prevent diffusion of the material configuring the light-to-heat conversion layer 12 to the side of the transfer layer 14g.

Figure 3B:
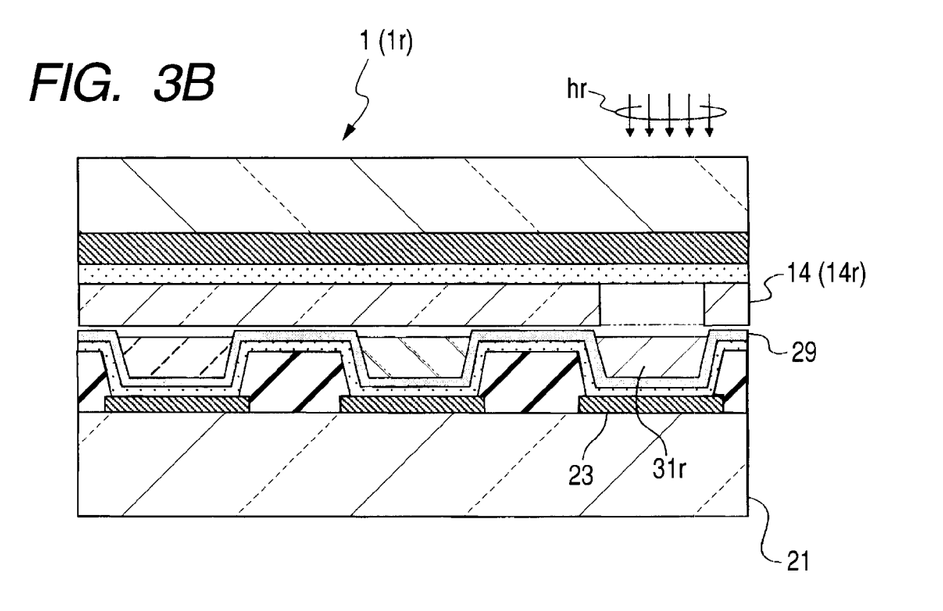

As shown in FIG. 3B, the transfer substrate 1 of the above-described configuration is made ready. In this example, as the transfer layer 14, prepared is the transfer substrate 1r provided with the red transfer layer 14r for formation of a red luminescent layer.

This transfer substrate 1r is disposed to face the device substrate 21 formed with the hole transport layer 29. From the side of the transfer substrate 1r, for example, any part of the area formed with the red luminescent device is selectively exposed, on a spot basis, with the laser light hr.

In this manner, on the lower electrode 23 of the device substrate 21 via the hole transport layer 29, a red luminescent layer 31r is patterned through selective thermal transfer of the red transfer layer 14r. For such thermal transfer, similarly to the pattering of the blue luminescent layer 31b described by referring to FIG. 2B, the red luminescent layer 31r is so formed that the materials configuring the red transfer layer 14r are mixed substantially uniform. During such layer formation, the diffusion prevention layer 13 serves well to prevent diffusion of the material configuring the light-to-heat conversion layer 12 to the side of the transfer layer 14r.

Note here that the processes of thermal transfer described by referring to FIGS. 2B to 3B are not specifically defined in order, and the processes of thermal transfer may be started from any of the luminescent layers 31b, 31g, and 31r.

The to-be-repeatedly-executed processes of thermal transfer are possible in the air, and desirable in a vacuum. Thermal transfer in a vacuum enables transferring using a laser of a lower energy level, thereby reducing the thermal harm possibly occurred to the to-be-transferred luminescent layers. What is more, with the processes of thermal transfer executed in a vacuum, preferably, the substrates are attached together more tightly, and the patterning accuracy is increased for transferring. If the processes of thermal transfer are all executed in a row in a vacuum, any possible element deterioration can be prevented.

Considered here is a case where a precise alignment mechanism is equipped to a drive portion of a laser head in a laser irradiation device. In such a case, in the above-described process of selectively irradiating the laser hr on a spot basis, the laser hr may be irradiated along the lower electrode 23 onto the transfer substrate 1 (1b, 1g, and 1r) with any appropriate spot diameter. At the time of such laser irradiation, there is no need to accurately position the device substrate 21 and the transfer substrate 1 (1b, 1g, and 1r). On the other hand, when the drive portion of the laser head is equipped with no such alignment mechanism, there needs to include a light-shielding film on the transfer substrate side for the aim of restricting the area for irradiation of the laser hr. To be specific, the transfer substrate 1 (1b, 1g, and 1r) is provided with, on its underside, a light-shielding film in which an aperture portion is formed to a highly-reflective metal layer that reflects the laser. Alternatively, a film of a low-reflective metal may be formed thereon. If this is the case, however, the device substrate 21 and the transfer substrate 1 (1b, 1g, and 1r) are required to be positioned with accuracy.

Figure 4A:
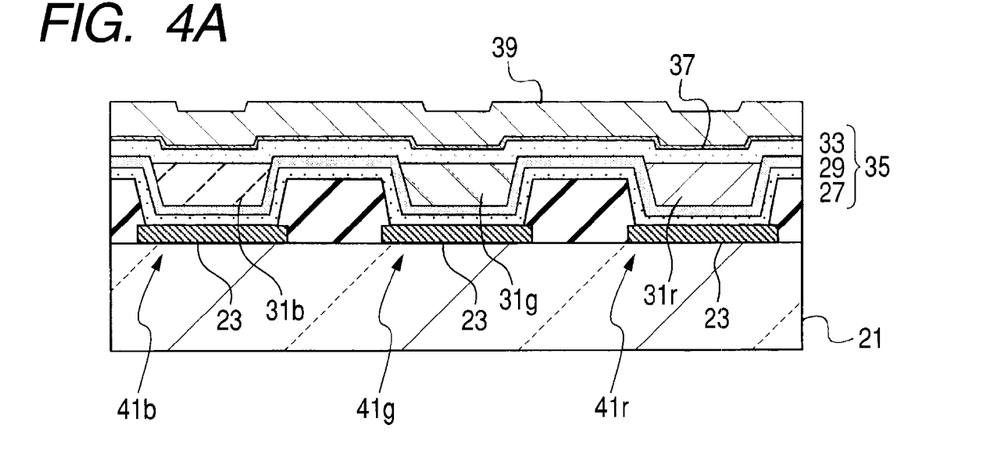
FIGS. 4A and 4B are both a cross sectional view of the display device of the embodiment, showing the second manufacturing process.

As shown in FIG. 4A, an electron transport layer 33 is formed by vapor deposition in the state as to entirely cover the device substrate 21 formed with the luminescent layers 31b, 31g, and 31r. The electron transport layer 33 is formed by vapor deposition entirely over the device substrate 21 as a common layer. Such an electron transport layer 33 is configured by using a general electron transport material, and as an example, a film of 8-hydroxyquinoline aluminum (Alq3) is formed by vapor deposition with the thickness of about 20 nm.

The layers formed as above, i.e., the hole injection layer 27, the hole transport layer 29, the luminescent layers 31b, 31g, and 31r, and the electron transport layer 33, configure an organic layer 35.

On the electron transport layer 33, an electron injection layer 37 is then formed by vapor deposition. This electron injection layer 37 is formed by vapor deposition as a common layer entirely over the device substrate 21. Such an electron injection layer 37 is configured by using a general electron injection material. As an example, a film of LiF (lithium fluoride) is formed by vacuum vapor deposition with the thickness of about 0.3 nm (vapor deposition speed of 0.01 nm/sec).

Thereafter, on the electron injection layer 37, an upper electrode 39 is formed. This upper electrode 39 is used as a cathode when the lower electrode 23 is an anode, and is used as an anode when the lower electrode 23 is a cathode. When the display device to be manufactured in this embodiment is of direct matrix, for example, the upper electrode 39 is formed in strip shape, for example, to intersect with the strip of the lower electrode 23. When the display device is of active matrix, the upper electrode 39 is solidly formed to cover the device substrate 21 in its entirety, and is shared for use among the pixels. In this case, an auxiliary electrode (not shown) is formed to the same layer as the lower electrode 23, and by establishing a connection between the auxiliary electrode and the upper electrode 39, the resulting configuration can favorably prevent the upper electrode 39 from being reduced in voltage.

The organic EL devices of various colors, i.e., the blue luminescent device 41b, the green luminescent device 41g, and the red luminescent device 41r, are formed to the portions where the lower electrode 23 and the upper electrode 39 are laminated, i.e., the portions sandwiching the organic layer 35 or others including the luminescent layers 31b, 31g, and 31r.

The upper electrode 39 is assumed as being formed by a material selected depending on how the light is extracted in the display device to be manufactured in this embodiment. That is, when the display device is of a top emitting type or a dual-side emitting type, i.e., the luminescent light is extracted from the side opposite to the device substrate 21, the upper electrode 39 is configured by the light-transmissive material or a translucent material. On the other hand, when the display device is of a transmissive type, i.e., the luminescent light is extracted from the side of the device substrate 21, the upper electrode 39 is configured by a highly-reflective material.

In this example, the display device is of a top emitting type, and the lower electrode 23 is used as an anode so that the upper electrode 39 is used as a cathode. In this case, the material configuring the upper electrode 39 is selected from the low-work-function materials exemplified in the process of forming the lower electrode 23. The material selected in this example is assumed as being a material having good light transmissive properties so as to allow electron injection with efficiency to the organic layer 35.

As such, the upper electrode 39 is formed by vacuum vapor deposition for use as a common cathode of MgAg (magnesium-silver) with the thickness of 10 nm. To form the upper electrode 39 as such, applied is a method with the particle energy lower to a level not affecting the base, e.g., vapor deposition or CVD (chemical vapor deposition).

When the display device is of a top emitting type, as the preferable designing, the upper electrode 39 is configured to be translucent, and the upper electrode 39 and the lower electrode 23 configure a resonator with an aim of increasing the extracted light intensity.

When the display device is of a transmissive type, and when the upper electrode 39 is used as a cathode, the upper electrode 39 is configured by a highly-reflective conductive material with a low work function. When the display device is of a transmissive type, and when the upper electrode 39 is used as an anode, the upper electrode 39 is configured by a highly-reflective conductive material.

Figure 4B:
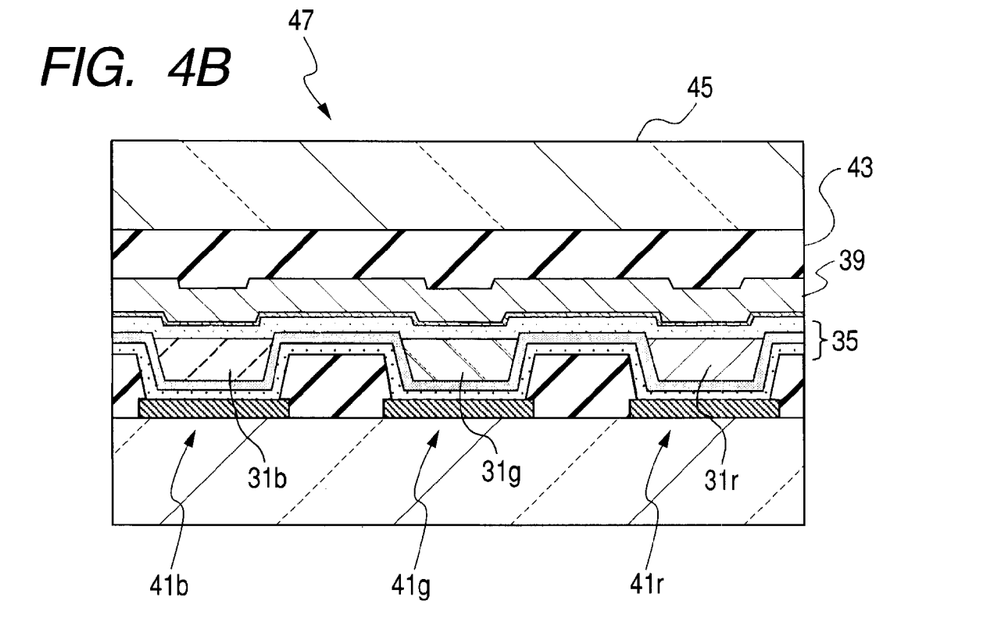

After the luminescent devices 41b, 41g, and 41r are formed as such, as shown in FIG. 4B, a protection film 43 is formed in the state to cover the upper electrode 39. This protection film 43 is aimed to protect the organic layer 35 from moisture, and is assumed as being formed with a material that hardly passes through and absorb water with a sufficient thickness. When the display device to be manufactured in this embodiment is of a top emitting type, this protection film 43 is made of a material that passes through lights generated by the luminescent layers 31b, 31g, and 31r, and assumed as being high in transmittance of about 80%, for example.

Such a protection film 43 may be configured by an insulation material. When the protection film 43 is configured by an insulation material, for example, the insulation material is preferably inorganic amorphous, e.g., amorphous silicon ($\alpha$-Si), amorphous silicon carbide ($\alpha$-SiC), amorphous silicon nitride ($\alpha$-Si1-x Nx), amorphous carbon ($\alpha$-C), and others. Such an insulation material of inorganic amorphous configures no grain so that the resulting protection film 43 hardly passes through water, and can have good properties.

For forming the protection film 43 made of amorphous silicon nitride, for example, the film is assumed as being formed by CVD with a film thickness of 2 to 3 μm. In this case, preferably, the temperature for film formation is set to room temperature with an aim of preventing the brightness reduction caused by deterioration of the organic layer 35. Moreover, the film is preferably formed under the conditions of minimizing the film stress with an aim of preventing the protection film 43 from being peeled off.

In another case where the display device to be manufactured in this embodiment is of active matrix, and when the upper electrode 39 serves as a common electrode covering entirely over the device substrate 21, the protection film 43 may be configured by using a conductive material. When the protection film 43 is configured by a conductive material, used is a transparent conductive material such as ITO or IZO (Indium Zinc Oxide).

The layers 33 to 43 covering the luminescent layers 31b, 31g, and 31r are formed solidly without using a mask. These layers 33 to 43 are preferably formed continuously in any one specific film formation device with no exposure to the air. If this is the case, the organic layer 35 can be protected from deterioration that is often caused by moisture in the air.

The device substrate 21 formed with the protection film 43 as such is affixed with a protection substrate 45 on the side of the protection film 43 via a resin material (not shown) for adhesion. The resin material for adhesion includes an ultraviolet curing resin, for example. The protection substrate 45 is exemplified by a glass substrate. Note that when the display device of this embodiment is of a top emitting type, the resin material for adhesion and the protection substrate 45 are required to be both configured by a light-transmissive material.

In the above-described manner, a full-color display device 47 is completed with the device substrate 21 formed thereon with the luminescent devices 41b, 41g, and 41r disposed in an array.

With the above-described manufacturing method, as described by referring to FIG. 2B and others, for example, the transfer substrate 1 is disposed between the light-to-heat conversion layer 12 and the transfer layer 14 with the diffusion prevention layer 13 to prevent diffusion of a material configuring the light-to-heat conversion layer 12. The transfer layer 14 of this transfer substrate 1 is thermally transferred onto the device substrate 21 as the luminescent layers 31b, 31g, and 31r. In this manner, the material diffusion is prevented from the light-to-heat conversion layer 12 to the side of the transfer layer 14. Accordingly, the luminescent layers 31b, 31g, and 31r are formed clean being protected from oxidation or contamination resulting from the light-to-heat conversion layer 12.

As such, the resulting luminescent layers 31b, 31g, and 31r can be free from impurity mixture and contamination. As shown in the following examples, the luminescent devices 41b, 41g, and 41r formed as such can have various advantages compared with an organic EL device formed with a luminescent layer with a transfer method using a conventional transfer substrate not formed with the diffusion prevention layer 13. The advantages include the higher luminescent efficiency, the lower drive voltage, and the longer brightness duration.

According to the embodiment described above, the luminescent layers 31b, 31g, and 31r can be patterned with good position accuracy by thermal transfer. The resulting luminescent devices 41b, 41g, and 41r can achieve the higher luminescent efficiency and the longer brightness duration compared with a case of forming a luminescent layer using a conventional transfer substrate.

Exemplified above is the case that, mainly, the lower electrode 23 is an anode, and the upper electrode 39 is a cathode. The invention is surely applicable also to a case where the lower electrode 23 is a cathode, and the upper electrode 39 is an anode. In such a case, the layers 25 to 37 between the lower electrode 23 and the upper electrode 39 are laminated in the inverse order.

The invention described above based on the embodiment is also effective to the devices in which the above-described common layer is separated. As shown in JP-A-2003-272860, for example, the invention is also effective to a tandem-type organic EL device being a unit laminate of organic layers including a luminescent layer, i.e., luminescent unit, and can derive the similar effects.

The transfer substrate of the invention can be widely used for patterning of organic layers, e.g., formation of an organic semiconductor layer such as organic semiconductor transistor in the manufacturing process of an organic semiconductor device. In this case, the transfer layer 14 in the transfer substrate 1 described by referring to FIG. 1 is formed as a layer made of an organic semiconductor material. By thermal transfer using such a transfer substrate 1, the organic semiconductor layer can be patterned with good position accuracy while being free from impurity mixture and contamination. This favorably enables to derive an organic semiconductor device with excellent device characteristics.

EXAMPLES

By referring to FIGS. 1 to 3B and the Table 1 below, the procedure of manufacturing various-color organic EL devices configuring a full-color display device is described as specific examples of the invention, and as comparison examples for the examples. The evaluation results are also described.

a. Example 1

The blue luminescent device 41b configuring a display device is manufactured in the processes of 1 to 4.

1. The transfer substrate 1b is manufactured as below. First of all, on the glass substrate (support substrate) 11, the light-to-heat conversion layer 12 is made by general sputtering using molybdenum (Mo) with the thickness of 200 nm. On the resulting light-to-heat conversion layer 12, the diffusion prevention layer 13 is formed by CVD using silicon nitride (SiNx) with the thickness of 100 nm. On the resulting diffusion prevention layer 13, the blue transfer layer 14b is formed by vacuum vapor deposition with a mixture of a host material being ADN with a blue luminescent guest material being DPAVBi with the weight percentage of 2.5.

2. On the glass device 21 serving as a device substrate for device manufacturing, the lower electrode 23 is formed as an anode. The lower electrode 23 is of two-layer configuration, being a laminate of APC (Ag—Pd—Cu) layer being a silver alloy layer (film thickness of 120 nm) and a transparent conductive layer made of ITO (film thickness 10 nm) in this order. Thereafter, the silicon oxide insulation film 25 is formed by sputtering with the thickness of about 2 μm, covering the outer edge of the lower electrode 23, and the lower electrode 23 is exposed therefrom by lithography for use as a pixel area. On the surface thereof, for use as the hole injection layer 27, a film of m-MTDATA is formed with the thickness of 25 nm. For use as the hole transport layer 29, a film of α-NPD is formed by vapor deposition with the thickness of 30 nm.

3. Next, in the state that the formed organic layers are disposed to face each other, the transfer substrate 1b manufactured in the process 1 is disposed on the device substrate 21 for device manufacturing, and these substrates are attached closely to each other in a vacuum. Between these substrates, there is a small space of about 2 μm due to the thickness of the insulation film 25. In this state, the laser light having a wavelength of 800 nm is irradiated from the underside of the transfer substrate 1b at the position facing the blue pixel area of the device substrate 21 for device manufacturing. With such laser irradiation, the blue transfer layer 14b is thermally transferred from the transfer substrate 1b so that the blue luminescent layer 31b is formed. The spot size of the laser light is 300 μm×10 μm in this example. The laser beam is used for scanning in the direction orthogonal to the longitudinal dimension of the beam. The energy density is 2.6E−3 mJ/μm2.

4. After the blue luminescent layer 31b is formed by transferring, the electron transport layer 33 is formed. For use as the electron transport layer 33, a film of 8-hydroxyquinoline aluminum (Alq3) is formed by vapor deposition with the thickness of about 20 nm. For use as the electron injection layer 37, a film of LiF is formed by vapor deposition with the thickness of about 0.3 nm (vapor deposition speed of 0.01 nm/sec). Thereafter, as a cathode to serve as the upper electrode 39, a film of MgAg is formed by vapor deposition with the thickness of 10 nm, and the result is the blue luminescent device 41b.

Example 2

In the procedure of manufacturing the transfer substrate 1b in the process 1 of Example 1, the blue luminescent device 41b is manufactured similarly to Example 1, except that the diffusion prevention layer 13 made of silicon oxide ($SiO_2$) is formed on the light-to-heat conversion layer 12 by CVD with the thickness of 100 nm, and the blue transfer layer 14b is formed thereon.

Comparison Example 1

In the procedure of manufacturing the transfer substrate 1b in the process 1 of Example 1, the blue luminescent device 41b is manufactured similarly to Example 1, except that the blue transfer layer 14b is directly formed on the light-to-heat conversion layer 12 without the diffusion prevention layer 13 therebetween.

Example 3

In the procedure of manufacturing the transfer substrate 1b in the process 1 of Example 1, the green luminescent device 41g is manufactured similarly to Example 1, except for the material configuring the transfer layer.

That is, when the transfer substrate 1g is manufactured in the process 1, on the light-to-heat conversion layer 12 formed on the glass substrate 11, the diffusion prevention layer 13 made of silicon nitride (SiNx) is formed by CVD with the thickness of 100 nm. On thus formed diffusion prevention layer 13, the green transfer layer 14g is formed by vacuum vapor deposition with a mixture of a host material being ADN with a green luminescent guest material being coumarin 6 with the weight percentage of 5.

Using the transfer substrate manufactured as such, the green luminescent device 41g is manufactured with the procedure similar to the processes 2 to 4 of Example 1.

Comparison 2

In the procedure of manufacturing the transfer substrate 1g in the process 1 of Example 3, the green luminescent device 41g is manufactured similarly to Example 4, except that the green transfer layer 14g is directly formed on the light-to-heat conversion layer 12 without the diffusion prevention layer 13 therebetween.

Example 4

In the procedure of manufacturing the transfer substrate 1b in the process 1 of Example 1, the red luminescent device 41r is manufactured similarly to Example 1, except for the material configuring the transfer layer.

That is, when the transfer substrate 1r is manufactured, on the light-to-heat conversion layer 12 formed on the glass substrate 11, the diffusion prevention layer 13 made of silicon nitride (SiNx) is formed by CVD with the thickness of 100 nm. On thus formed diffusion prevention layer 13, the red transfer layer 14r is formed by vacuum vapor deposition with a mixture of a host material being ADN with a red luminescent guest material being BSN with the weight percentage of 30.

Using the transfer substrate manufactured as such, the red luminescent device 41r is manufactured with the procedure similar to the processes of 2 to 4 of Example 1.

Comparison 3

In the procedure of manufacturing the transfer substrate 1r in the process 1 of Example 4, the red luminescent device 41r is manufactured similarly to Example 1, except that the red transfer layer 14r is directly formed on the light-to-heat conversion layer 12 without the diffusion prevention layer 13 therebetween.

Evaluation Results

For Examples 1 to 4 and Comparison Examples 1 to 3 as above, the test is conducted to see whether diffusion is observed from the light-to-heat conversion layer (Mo) to the luminescent layer. This test is conducted by secondary ion mass spectrometry (SIMS) in the state that the luminescent layers are formed by transferring in the similar manner. The test result tells that, with comparison examples 1 to 3, an element (Mo) configuring the light-to-heat conversion layer is detected in the area of luminescent layer, and there is a diffusion to the luminescent layer side (transfer layer side) of the light-to-heat conversion layer. On the other hand, with Examples 1 to 4, no diffusion of the element (Mo) configuring the light-to-heat conversion layer is observed in the area of luminescent layer. This thus verifies the effects of diffusion prevention by the diffusion prevention layer between the light-to-heat conversion layer and the transfer layer.

For the organic EL devices manufactured as above, in the state under a constant current density of 40 mA/cm2, the chromaticity and the luminescent efficiency are measured using a spectral radiance scale. The drive voltage is measured in the state that the current is set for application in such a manner that the devices made of the same luminescent guest material emit light with the same brightness. The duration test is also conducted to see the reduction ratio of the relative brightness after a lapse of 100 hours. The results are shown in Table 1 below.

TABLE 1

| | | Diffusion Prevention Layer 13 | CIE Chromaticity | | Luminescent Efficiency | Drive Voltage | Brightness Reduction Ratio |
|---|---|---|---|---|---|---|---|
| | | | X | Y | [cd/A] | [V] | [%] |
| Blue luminescent Device | EX1 | SiNx | 0.16 | 0.33 | 9.94 | 5.01 | 18 |
| | EX2 | SiO$_2$ | 0.16 | 0.31 | 9.41 | 5.14 | 27 |
| | Comparison1 | — | 0.16 | 0.32 | 4.25 | 6.09 | 34 |
| Green luminescent Device | EX3 | SiNx | 0.22 | 0.68 | 23.20 | 5.11 | 13 |
| | Comparison2 | — | 0.22 | 0.66 | 14.00 | 6.09 | 35 |
| Red luminescent Device | EX4 | SiNx | 0.64 | 0.32 | 8.76 | 5.14 | 13 |
| | Comparison3 | — | 0.63 | 0.32 | 6.02 | 6.51 | 29 |

First of all, a comparison is made among the evaluation results for the blue luminescent devices manufactured in Examples 1 and 2 and that manufactured in Comparison Example 1. The comparison result tells that the blue luminescent devices of Examples 1 and 2 manufactured using the transfer substrate 1b provided with the diffusion prevention layer 13 achieves various effects compared with the blue luminescent device of Comparison 1 manufactured using a transfer substrate provided with no diffusion prevention layer. The effects include those of considerably increasing the luminescent efficiency to be twice or more, those of reducing the drive voltage, and those of suppressing low the brightness reduction ratio. These blue luminescent devices show the chromaticity of the same level.

With a comparison between the devices of Examples 1 and 2, the device including a layer of SiNx of Example 1 for use as an oxidation protection layer shows the effects of increasing the duration compared with the device including a layer of $SiO_2$ of Example 2 for use as an oxidation protection layer. This comparison result tells that, although the layers of $SiO_2$ and Mo ($MoO_x$ formed on the surface) serve well to prevent material diffusion and oxidation, the device using a layer of SiNx shows effects more apparently.

A comparison is also made among the evaluation results for the green luminescent devices manufactured in Example 3 and Comparison Example 2. The comparison result tells that the green luminescent device of Example 3 manufactured using the transfer substrate 1g provided with the diffusion prevention layer 13 of SiNx shows satisfactory characteristics compared with the green luminescent device in Comparison 2 manufactured using a transfer substrate provided with no diffusion prevention layer. The satisfactory characteristics are those in terms of luminescent efficiency, drive voltage, and brightness reduction ratio. Especially coumarin 6 used as a green luminescent guest material for the green luminescent devices has low electron transportability, and is very good at increasing the luminescent efficiency by using a transfer substrate provided with a diffusion prevention layer when the luminescent layer using such a guest material is transferred.

A comparison is also made among the evaluation results for the red luminescent devices manufactured in Example 4 and Comparison Example 3. The comparison result tells that the red luminescent device of Example 4 manufactured using the transfer substrate 1r provided with the diffusion prevention layer 13 of SiNx shows satisfactory characteristics compared with the red luminescent device in Comparison 23 manufactured using a transfer substrate provided with no diffusion prevention layer. The satisfactory characteristics are those in terms of luminescent efficiency, drive voltage, and brightness reduction ratio, and these are achieved without changing the luminescent colors.

Such comparison results tell that by forming the luminescent layers 31b, 31g, and 31r through thermal transfer, in a full-color display device using organic EL devices, the characteristics of the organic EL devices 41b, 41g, and 41r of various colors can be kept satisfactorily good.

It should be understood by those skilled in the art that various modifications, combinations, sub-combinations and alterations may occur depending on design requirements and other factors insofar as they are within the scope of the appended claims or the equivalents thereof.

What is claimed is:

1. A transfer substrate comprising:
    a support substrate being a glass substrate;
    a light-to-heat conversion layer;
    a diffusion prevention layer preventing diffusion of a material constituting the light-to-heat conversion layer, the diffusion prevention layer being made of a silicon nitride film; and
    a transfer layer made of an organic material,
    wherein
    the light-to-heat conversion layer, the diffusion prevention layer and the transfer layer are formed on the support substrate in this order.

2. The transfer substrate according to claim 1, wherein the light-to-heat conversion layer comprises a metal material.

3. The transfer substrate according to claim 1, wherein the transfer layer comprises a luminescent material.

4. A transfer method, comprising the steps of:
    disposing a transfer substrate including a support substrate being a glass substrate having thereon a light-to-heat conversion layer, a diffusion prevention layer made of a silicon nitride film and a transfer layer made of an organic material in this order, with an arrangement of the transfer layer being directed to a receptor having a space therebetween; and
    thermally transferring the transfer layer to the receptor side where the space exists by irradiating a light from the support substrate side such that the light is thermally converted in the light-to-heat conversion layer while diffusion of a material constituting the light-to-heat conversion layer is prevented.

5. An organic electroluminescent device manufacturing method comprising the steps of:
    forming a lower electrode patterned on a substrate;
    forming an organic layer including at least a luminescent layer on the lower electrode; and
    forming an upper electrode in the state that the upper electrode is laminated over the lower electrode via the organic layer,
    wherein,
    after the lower electrode is patterned on the substrate,
    a transfer substrate including a support substrate being a glass substrate having thereon a light-to-heat conversion layer, a diffusion prevention layer made of a silicon nitride film and a transfer layer made of an organic material including a luminescent material in this order, is disposed in an arrangement of the transfer layer being directed to the substrate so as to make a space between the transfer layer and the lower electrode, and
    the transfer layer is thermally transferred onto the lower electrode where the space exists by thermal conversion of the light in the light-to-heat conversion layer by irradiating a light from the support substrate side such that the light is thermally converted in the light-to-heat conversion layer while diffusion of a material constituting the light-to-heat conversion layer is prevented.

6. The transfer substrate according to claim 1, wherein the light-to-heat conversion layer is configured by a molybdenum film.

7. The transfer method according to claim 4, wherein the light-to-heat conversion layer is configured by a molybdenum film.

8. The organic electroluminescent device manufacturing method according to claim 5, wherein the light-to-heat conversion layer is configured by a molybdenum film.

* * * * *